United States Patent
Chen et al.

(10) Patent No.: US 6,811,039 B2
(45) Date of Patent: Nov. 2, 2004

(54) DETACHABLE DEVICE OF A CABLE MANAGEMENT ARM FOR FURNITURE

(75) Inventors: Ken-Ching Chen, Kaohsiung Hsien (TW); Chun-Chiang Wang, Kaohsiung Hsien (TW); I-Ming Tseng, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 7 days.

(21) Appl. No.: 10/310,876

(22) Filed: Dec. 6, 2002

(65) Prior Publication Data

US 2004/0108289 A1 Jun. 10, 2004

(51) Int. Cl.$^7$ .................................................. A47F 7/00
(52) U.S. Cl. ...................................... 211/26; 312/223.6
(58) Field of Search ......................... 211/26, 26.2, 183, 211/189; 312/223.6, 223.1, 223.2; 361/826, 829, 725, 727, 683; 248/298.1, 235

(56) References Cited

U.S. PATENT DOCUMENTS

| | | | | |
|---|---|---|---|---|
| 4,895,333 A | * | 1/1990 | Antinora | 248/289.11 |
| 5,571,256 A | * | 11/1996 | Good et al. | 211/26 |
| 6,070,742 A | * | 6/2000 | McAnally et al. | 211/26 |
| 6,142,590 A | * | 11/2000 | Harwell | 312/223.1 |
| 6,435,354 B1 | * | 8/2002 | Gray et al. | 211/26 |
| 6,442,030 B1 | * | 8/2002 | Mammoser et al. | 361/727 |
| 6,523,918 B1 | * | 2/2003 | Baiza | 312/265.1 |
| 2001/0037985 A1 | * | 11/2001 | Varghese et al. | 211/26 |

* cited by examiner

*Primary Examiner*—Carl D. Friedman
*Assistant Examiner*—Jennifer E. Novosad
(74) *Attorney, Agent, or Firm*—Bacon & Thomas, PLLC

(57) ABSTRACT

A detachable device of a cable management arm. The device includes a detachable plate, a bracket, and a retaining member combining with the cable management arm between a computer rack and a component drawer. The detachable plate includes engaging members integrally formed thereon. The bracket includes a positioning hole, and assembling holes adapted to receive the associated engaging members. The retaining member is pivotally mounted to the detachable plate. The retaining member includes a protrusion adapted to extend into the positioning hole of the bracket, and an elastic member adapted to maintain a retaining relationship with an assembled position or a disassembled position defined in the positioning hole of the bracket.

15 Claims, 4 Drawing Sheets

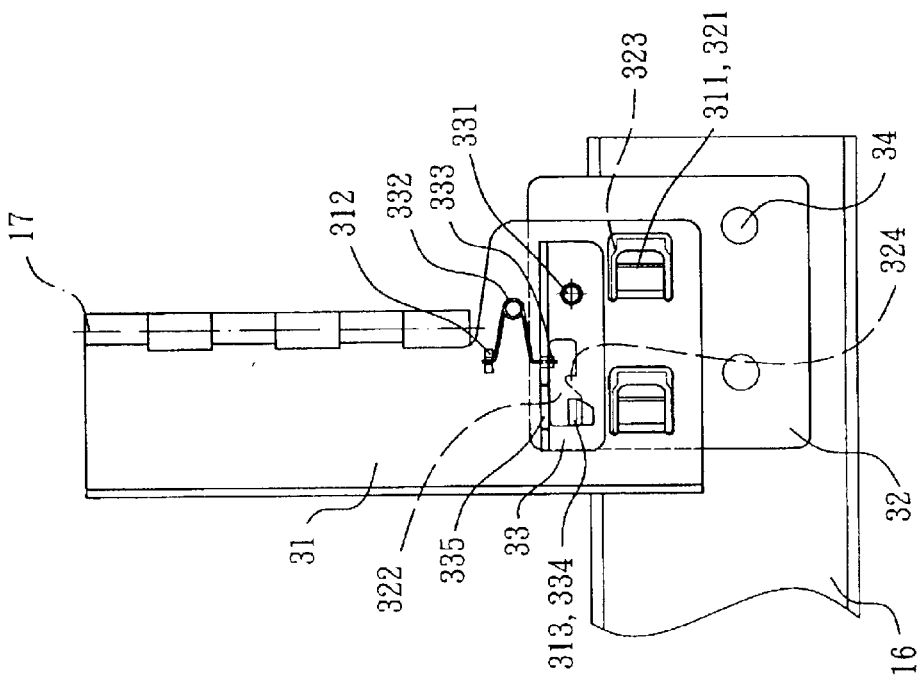
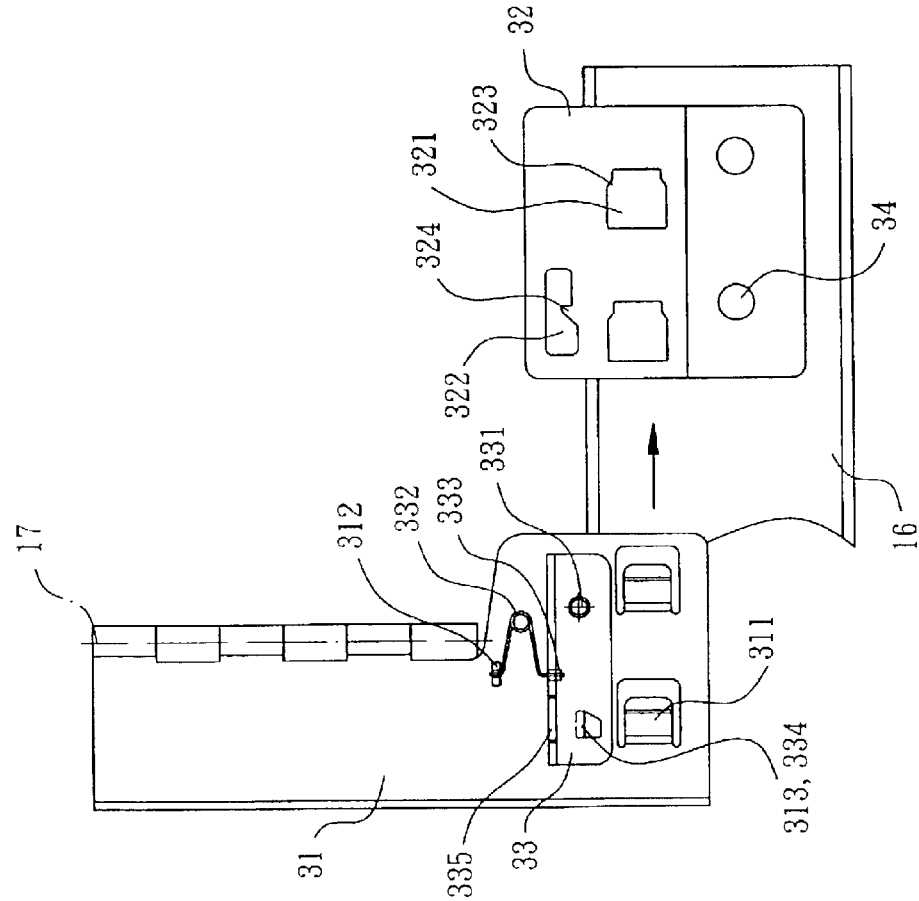

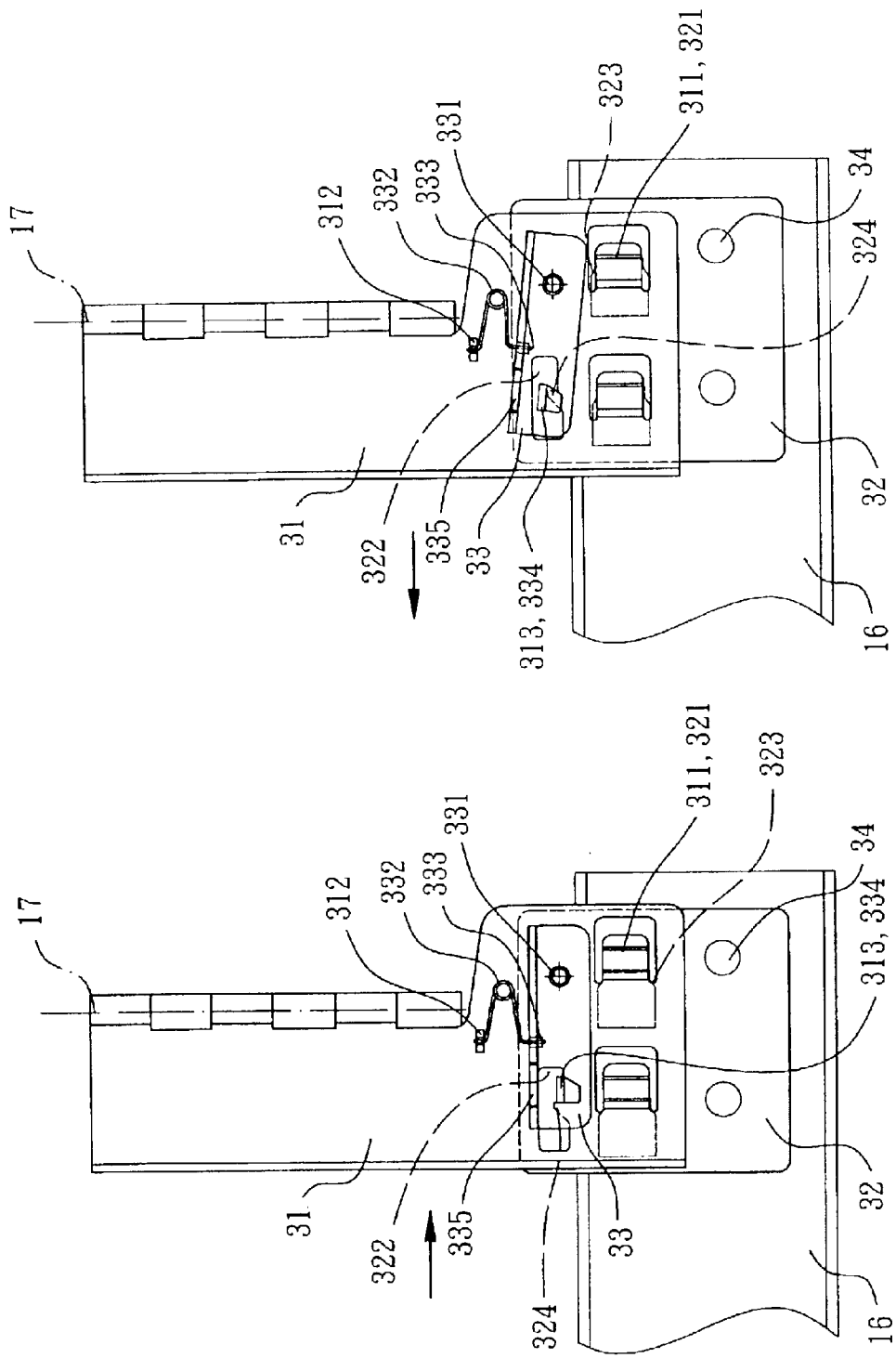

DETACHABLE DEVICE OF A CABLE MANAGEMENT ARM FOR FURNITURE

BACKGROUND OF THE INVENTION

1. Field of the Invention

The present invention is related to a detachable device of a cable management arm for furniture and more particularly to utilizing a detachable plate, a bracket and a retaining member combining the cable management arm with a computer rack or a furniture member.

2. Description of the Related Art

Big industrial system, like factory computer and server, is consisted of a rack, and a plurality of individual component drawers. Large numbers of data cables and power cables connected between the rack and the component draw are usually served to communicate with other components and power supply. In order to flexibly repair and service the components installed, a cable management arm is generally used to manage these cables.

Referring to FIG. 1, a conventional cable management arm 10 comprises a plurality of cable arms 11, at least one pivotal member 12, a pair of end brackets 13 and 14. The cable arms 11 are used to mount the cables (not labeled) therein and connected by the pivotal member 12, so as to allow the cable arms 11 to fold. The two end brackets 13 and 14 connected to two ends of the combination of the cable arms 11 are fixed on a predetermined rare position of a computer rack 80 and a component drawer 90. Moreover, the conventional cable management arm 10 comprises an adjusting track 15 mounted to the computer rack 80, and an engaging member 20 positioned on a slot of the adjusting track 15. An adjustable assembling position of the end bracket 13 on the adjusting track 15 resolves a single size of the cable management arm 10 adapted to apply in various depth sizes of the computer rack 80.

The adjusting track 15 and the engaging member 20 is convenient for repairing, serving the cable management arm 10 in the computer rack 80. It is complicated that users must operate in a limited space formed in the computer rack 80 to fasten or release a screw 21 fixed on the engaging member 20. Consequently, it is also complicated that users assemble or disassemble the cable management arm 10 on the computer rack 80 in regular operations. There is a need for a detachable device adapted to remove the cable management arm 10 convenient.

The present invention intends to provide a detachable device of a cable management arm for furniture adapted to assemble or disassemble the cable management arm on a computer rack in such a way to mitigate and overcome the above problem.

SUMMARY OF THE INVENTION

The primary objective of this invention is to provide a detachable device of a cable management arm comprising a detachable plate, a bracket and a retaining member to thereby assemble or disassemble the cable management arm on a computer rack.

The secondary objective of this invention is to provide the detachable device of the cable management arm comprising a bracket adapted to provide with various assembling positions for the detachable plate, thereby adjusting positions of the cable management arm in various depth sizes of the computer rack.

The detachable device of the cable management arm of the present invention mainly comprises a detachable plate, a bracket, and a retaining member combining with the cable management arm between a computer rack and a component drawer. The detachable plate includes a plurality of engaging members integrally formed thereon. The bracket includes a positioning hole, and a plurality of assembling holes adapted to receive the associated engaging members. The retaining member is pivotally mounted to the detachable plate. The retaining member includes a protrusion adapted to extend into the positioning hole of the bracket, and an elastic member adapted to maintain a retaining relationship with an assembled position or a disassembled position defined in the positioning hole of the bracket.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein:

FIG. 3 is a schematic view of the detachable device of the cable management arm in accordance with the embodiment of the present invention, showing a pre-assembling relationship of a detachable plate and a bracket;

FIG. 4 is a schematic view of the detachable device of the cable management arm in accordance with the embodiment of the present invention, showing an initial assembled relationship of the detachable plate and the bracket;

FIG. 5 is a schematic view of the detachable device of the cable management arm in accordance with the embodiment of the present invention, showing a final assembled relationship of the detachable plate and the bracket; and FIG. 6 is a schematic view of the detachable device of the cable management arm in accordance with the embodiment of the present invention, showing a disassembling relationship of the detachable plate and the bracket.

DETAILED DESCRIPTION OF THE INVENTION

Figure 1:
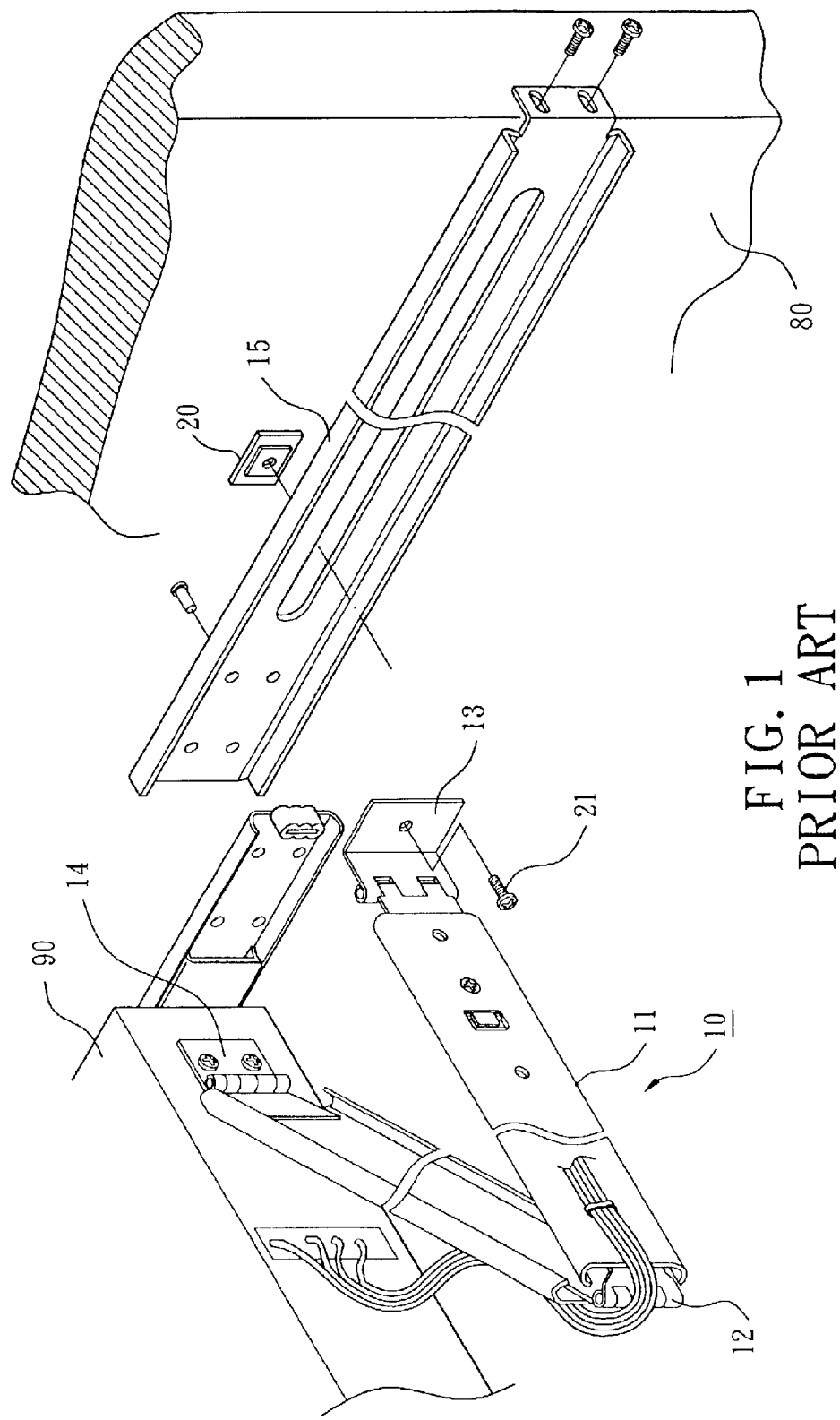
FIG. 1 is a perspective view of a conventional cable management arm in accordance with the prior art.
Figure 2:
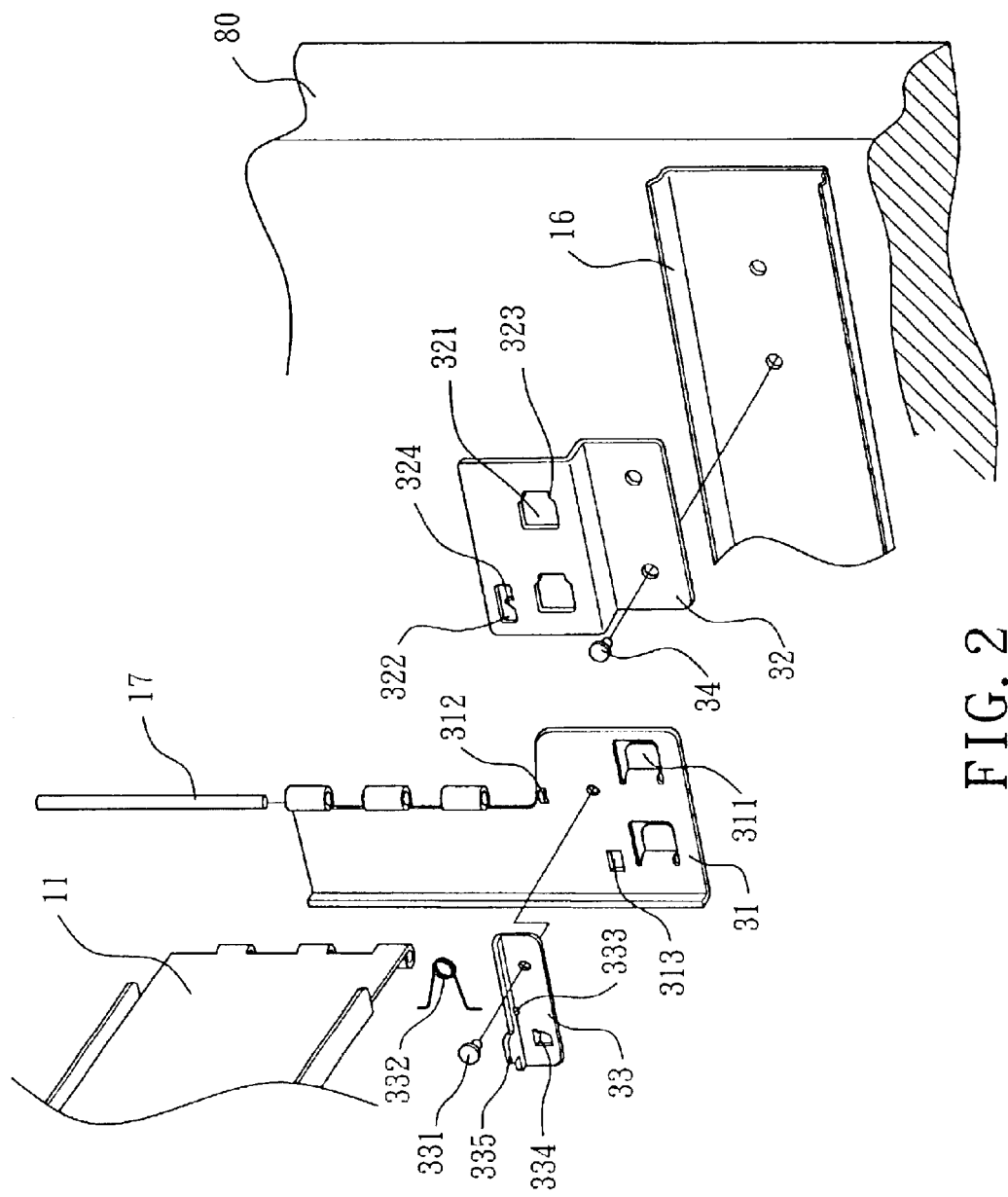
FIG. 2 is a perspective view of a detachable device of a cable management arm in accordance with an embodiment of the present invention.

Referring initially to FIG. 2, reference numerals of an embodiment have applied the identical numerals of the conventional cable management arm. The cable management arm of the embodiment has the similar configuration and same function as the conventional one and the detailed descriptions are omitted.

Referring to FIG. 2, a detachable device of a cable management arm in accordance with the embodiment of the present invention mainly includes a detachable plate 31, a bracket 32, and a retaining member 33 combining with the cable management arm between a computer rack 80 and a component drawer. The detachable plate 31 includes a plurality of engaging members 311 integrally formed thereon. The bracket 32 includes a positioning hole 322, and a plurality of assembling holes 321 adapted to receive the associated engaging members 311. The retaining member 33 is pivotally mounted to the detachable plate 31. The retaining member 33 includes a protrusion 334 adapted to extend into the positioning hole 322 of the bracket 32. The retaining member 33 further includes an elastic member 321 adapted to maintain a protrusion in a retaining relationship with an assembled position or a disassembled position defined in the positioning hole 322 of the bracket 32.

Referring again to FIG. 2, the detachable plate 31 is pivotally connected to an arm 11 of the cable management arm by a pin 17. The detachable plate 31 further includes a first fixing hole 312 and an operating window 313. Preferably, each of the engaging members 311 is integrally formed on the detachable plate 31 by punching, and extended from an associated neck portion (not labeled) connecting to the detachable plate 31. The engaging members 311 and the neck portions are permitted passage through the associated assembling hole 321 of the bracket 32 when assembled. Moreover, the fixing hole 312 is used to hold a first end of the elastic member 332 while the operating window 313 is used to permit passage of the protrusion 334 of the retaining member 33.

Referring again to FIG. 2, the bracket 32 is connected to an inner wall of the computer rack 80 or a track 16, mounted to the computer rack 80, by screws 34. The bracket 32 further includes a narrow end 323 at the assembling holes 321 adapted to fittingly engage with the neck portion of the engaging member 311, and a one-way tooth 324 firmed in the positioning hole 322. Preferably, the one-way tooth 324 comprises an inclined edge adapted to permit an assembling movement of the protrusion 334 of the retaining member 33, and a vertical edge (or an acute angled edge) adapted to limit a disassembling movement of the protrusion 334 of the retaining member 33.

Referring again to FIG. 2, the retaining member 33 is pivotally mounted to the detachable plate 31 by a pivotal member 331. The retaining member 33 further includes a second fixing hole 333 used to hold a second end of the elastic member 332 for biasing from a first fixing hole 312, and an operating button 335 integrally formed on the retaining member 33 by punching. A downward bias force of the elastic member 332 limits the protrusion 334 resting either side of the one-way tooth 324 of the positioning hole 322. Users can push the operating button 335 upward to thereby overcome the downward bias force for releasing the protrusion 334 from the one-way tooth 324.

Referring to FIGS. 3 through 5, the bracket 32 has been connected to the track 16, mounted to the computer rack 80, by screws 34. The engaging members 311 of the detachable plate 31 are aligned horizontal with the assembling holes 321 of the bracket 32, as shown in FIG. 3. The engaging members 311 are passed through the assembling holes 321 the assembling holes 321 in an initially assembling relationship. The protrusion 332 is forced and rested at a position proximal the inclined edge of the one-way tooth 324 in the positioning hole 322, as shown in FIG. 4. After the detachable plate 31 is moved a final assembling movement relative to the bracket 32, each neck portion of the engaging members 311 is fittingly engaged with the associated narrow ends 323 of the assembling holes 321. Meanwhile, the protrusion 334 has passed the inclined edge and rests at a position proximal the vertical edge of the one-way tooth 324 in the positioning hole 322, as shown in FIG. 5.

Referring to FIG. 6, when the cable management arm is disassembled from the computer rack 80, users can push the operating button 335 upward to overcome the elastic member 332 to thereby release the protrusion 334 from the vertical edge of the one-way tooth 324 in the positioning hole 322. Subsequently, the detachable plate 31 is moved a disassembling movement relative to the bracket 32, and completely released therefrom.

The bracket 32 of the present invention is further designated to provide with various assembling positions of the assembling holes 321 and the positioning holes 322 for assembling the detachable plate 31 in various assembling positions. Thereby a singular size of the cable management arm is applied to various depth sizes of the computer rack 80 by selecting the assembling positions of the detachable plate 31 and the cable management arm with respect to the bracket 32.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A detachable device connected between a cable management arm and a computer rack, comprising:
   a detachable plate including a plurality of engaging members; the detachable plate is pivot-connected to the cable management arm;
   a bracket connected to the computer rack, the bracket including a plurality of assembling holes adapted to receive corresponding ones of the engaging members, and a positioning hole; and
   a retaining member being pivotally connected to the detachable plate, the retaining member including a protrusion adapted to extend into the positioning hole, and an elastic member connected between the detachable plate and the retaining member and adapted to maintain the protrusion in a retaining relationship with an assembled position or a disassembled position defined in the positioning hole of the bracket.

2. The detachable device as defined in claim 1, wherein the bracket further includes a first end and second end including at least one of the assembling holes, and the second end is adapted to fittingly engage with at least one of the engaging members.

3. The detachable device as defined in claim 2, wherein the engaging member further includes a neck portion adapted to fittingly engage with of the assembling hole.

4. The detachable device as defined in claim 1, wherein the engaging members are integrally formed on the detachable plate by punching.

5. The detachable device as defined in claim 1, wherein the protrusion is integrally formed on the retaining member by punching.

6. The detachable device as defined in claim 1, a one-way tooth is formed in the positioning hole to thereby maintain the protrusion in a retaining relationship with an assembled position or a disassembled position defined in the positioning hole.

7. The detachable device as defined in claim 6, wherein the one-way tooth comprises an inclined edge adapted to permit an assembling movement of the protrusion of the retaining member, and a vertical edge adapted to limit a disassembling movement of the protrusion of the retaining member.

8. The detachable device as defined in claim 6, wherein the one-way tooth comprises an inclined edge adapted to permit an assembling movement of the protrusion of the retaining member, and an acute angled edge adapted to limit a disassembling movement of the protrusion of the retaining member.

9. The detachable device as defined in claim 1, wherein the bracket is provided with various assembling positions of the assembling holes and the positioning holes which are adapted to selectively receive the engaging members of the detachable plate in the various assembling positions, thereby a singular size of the cable management arm can be applied to various depth sizes of the computer rack by selecting the assembling positions of the detachable plate and the cable management arm with respect to the bracket.

10. The detachable device as defined in claim 1, wherein the detachable plate further includes an operating window adapted to permit passage of the protrusion of the retaining member.

11. The detachable device as defined in claim 1, wherein the elastic member has two ends holding in a first fixing hole of the detachable plate and a second fixing hole of the retaining member, to thereby bias the retaining member on the detachable plate.

12. The detachable device as defined in claim 1, wherein the retaining member further includes an operating button which can be pushed upwards for releasing the protrusion from a one-way tooth that separates the assembled position or the disassembled position in the positioning hole.

13. The detachable device as defined in claim 1, wherein the bracket is connected to an inner wall of the computer rack by screws.

14. The detachable device as defined in claim 1, an inner wall of the computer rack is connected with a plurality of slide tracks adapted to retract or draw out a component drawer.

15. The detachable device as defined in claim 14, wherein the bracket is connected to the track, and the track is mounted to the computer rack by screws.

* * * * *